US008890196B2

(12) United States Patent
Zimmerman et al.

(10) Patent No.: US 8,890,196 B2
(45) Date of Patent: Nov. 18, 2014

(54) LIGHTWEIGHT SELF-COOLING LIGHT SOURCES

(71) Applicants: Scott M. Zimmerman, Basking Ridge, NJ (US); William R. Livesay, San Diego, CA (US); Richard L. Ross, Del Mar, CA (US); Eduardo DeAnda, San Diego, CA (US)

(72) Inventors: Scott M. Zimmerman, Basking Ridge, NJ (US); William R. Livesay, San Diego, CA (US); Richard L. Ross, Del Mar, CA (US); Eduardo DeAnda, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 13/815,682

(22) Filed: Mar. 14, 2013

(65) Prior Publication Data
US 2014/0264359 A1 Sep. 18, 2014

(51) Int. Cl.
| | |
|---|---|
| H01L 29/22 | (2006.01) |
| H01L 29/227 | (2006.01) |
| H01L 33/00 | (2010.01) |
| H01L 29/24 | (2006.01) |
| H01L 29/06 | (2006.01) |
| H01L 31/0328 | (2006.01) |
| H01L 31/0336 | (2006.01) |
| H01L 31/072 | (2012.01) |
| H01L 31/109 | (2006.01) |
| H01L 33/64 | (2010.01) |

(52) U.S. Cl.
CPC .................................... H01L 33/64 (2013.01)
USPC ............... 257/98; 257/13; 257/94; 257/103; 257/E33.026; 257/E33.027; 257/E33.031; 257/E33.032; 257/E33.056; 257/E33.059; 257/E33.061; 257/E33.06; 257/E33.075

(58) Field of Classification Search
CPC .............. H01L 21/563; H01L 23/3157; H01L 23/49861; H01L 24/96; H01L 31/0203; H01L 2224/12105; H01L 2224/29298
USPC ........ 257/13, 94, 98, 103, E33.026, E33.027, 257/E33.031, E33.032, E33.056, E33.059, 257/E33.061, E33.066, E33.075
See application file for complete search history.

(56) References Cited

U.S. PATENT DOCUMENTS 6,545,344 B2 * 4/2003 Abbott ......................... 257/666
6,634,770 B2 10/2003 Cao (Continued)

FOREIGN PATENT DOCUMENTS

JP 2746192 2/1998

OTHER PUBLICATIONS

Mesli, "Improvement of Ultra High Brightness White LEDs from Global Light Industries" Proc. SPIE 6797, Manufacturing LEDs for Lighting and Displays, (2007) pp. 67970N1 to N9.

(Continued)

*Primary Examiner* — Ida M Soward
(74) *Attorney, Agent, or Firm* — William Propp, Esq.

(57) ABSTRACT

A solid-state light source has light emitting diodes embedded in a thermally conductive translucent luminescent element. The thermally conductive translucent luminescent element has optically translucent thermal filler and at least one luminescent element in a matrix material. A leadframe is electrically connected to the light emitting diodes. The leadframe distributes heat from the light emitting diodes to the thermally conductive translucent luminescent element. The thermally conductive translucent luminescent element distributes heat from light emitting diodes and the thermally conductive translucent luminescent element.

3 Claims, 6 Drawing Sheets

(56) References Cited

U.S. PATENT DOCUMENTS

| | | | |
|---|---|---|---|
| 7,285,791 B2 | 10/2007 | Beeson et al. | |
| 7,497,597 B2 * | 3/2009 | Suehiro et al. | 362/294 |
| 7,573,189 B2 * | 8/2009 | Juestel et al. | 313/503 |
| 7,646,141 B2 * | 1/2010 | Kim et al. | 313/486 |
| 7,795,600 B2 | 9/2010 | Beeson et al. | |
| 7,795,625 B2 * | 9/2010 | Suzuki | 257/81 |
| 7,804,099 B2 | 9/2010 | Beeson et al. | |
| 7,884,544 B2 * | 2/2011 | Takezawa et al. | 313/512 |
| 7,910,940 B2 * | 3/2011 | Koike et al. | 257/98 |
| 7,935,981 B2 * | 5/2011 | Lee et al. | 257/99 |
| 8,158,983 B2 | 4/2012 | Beeson et al. | |
| 8,399,900 B2 * | 3/2013 | Hartmann | 257/98 |
| 8,471,459 B2 * | 6/2013 | Kato et al. | 313/503 |
| 8,564,005 B2 * | 10/2013 | Park et al. | 257/98 |
| 2004/0124758 A1 * | 7/2004 | Danielson et al. | 313/486 |
| 2004/0188697 A1 * | 9/2004 | Brunner et al. | 257/99 |
| 2005/0227569 A1 * | 10/2005 | Maeda et al. | 445/25 |
| 2009/0230419 A1 * | 9/2009 | Lee et al. | 257/98 |
| 2010/0022040 A1 * | 1/2010 | Konishi et al. | 438/29 |
| 2010/0025709 A1 * | 2/2010 | Koseki et al. | 257/98 |
| 2010/0127286 A1 * | 5/2010 | Schmidt et al. | 257/98 |
| 2010/0140641 A1 * | 6/2010 | Kinomoto et al. | 257/98 |
| 2010/0155758 A1 * | 6/2010 | Kumei et al. | 257/98 |
| 2010/0181580 A1 * | 7/2010 | Masuda | 257/89 |
| 2010/0213490 A1 * | 8/2010 | Park et al. | 257/98 |
| 2010/0224895 A1 * | 9/2010 | Murazaki et al. | 257/98 |
| 2011/0084232 A1 * | 4/2011 | Mueller-Mach et al. | 252/301.4 F |
| 2013/0207148 A1 * | 8/2013 | Krauter et al. | 257/98 |
| 2014/0008680 A1 * | 1/2014 | Won et al. | 257/98 |

OTHER PUBLICATIONS

Griffin, "Scattering of Ultraviolet Radiation in Turbid Suspensions", J. Appl. Phys. 81 (6), Mar. 15, 1997, pp. 2538 to 2546.

* cited by examiner

LIGHTWEIGHT SELF-COOLING LIGHT SOURCES

BACKGROUND OF THE INVENTION

Historically, all lighting sources have been self-cooling emitters. The emitting and cooling surfaces are essentially the same surfaces for incandescent, fluorescent, halogen, and arc lamps. In addition, over the years, there have been developments which have reduced the weight of these sources such that greater than 30 lumens per gram output levels have been achieved. A wide range of technology advances have occurred ranging from thin glass or ceramic envelopes to metal/glass joining techniques which have allowed incandescent lamps in particular to reduce weight and costs even though operating temperature can exceed several hundred degrees Celsius. Lighter weight materials means less material costs, lower shipping costs, and reduced weight and costs for the fixtures and luminaires that the bulbs go into. The solid-state lighting industry has taken a much different approach based on high-powered packages with separate heat sinks. Unlike every other light source, solid-state light sources must be designed around heat sinks, fans, and active cooling elements. This creates added cost for the light sources and the fixtures, which use these sources. In addition, because heat sinks and fans must be integrated into the fixtures and luminaires it is very difficult to standardize the light source. The LED manufacturers each have their own standard package but it does not include the heat sink or cooling means and in many cases cannot be mounted without the use of soldering or wirebonding steps. This makes field replaceable light sources difficult as well. While the longer life of solid state light sources does mitigate the need to replace the light source on a regular basis, long life does not address the need for change out due to changing user preference or product updates. The need exists for lightweight solid state light sources which contain not only the means for generating the light and electrical interconnect means to the light but also includes the ability to cool the light. There is a need for lightweight self cooling solid state light sources which address reduce costs and allow for standardization of solid state light sources.

A typical incandescent bulb outputs 1200 lumens and weighs 40 grams, which translates into an output of 30 lumens per gram. A compact fluorescent typically outputs 20 lumens per gram. A typical solid-state light bulb outputs 3 lumens per gram due to the added weight of the heat sink, interconnect package, diffusers and other required elements. This low lumens per gram is mainly driven by the LED (light emitting diode) manufacturers desire to sell packages rather than die (additional levels of electrical interconnect and thermal interfaces) and the heat sink or cooling means weight. As stated earlier, not only does this lead to increased weight, which leads to increased materials costs, but this approach also leads to added shipping costs, and added costs for the fixtures and luminaires. In some cases, additional safety supports are required to hold up the heat sinks for solid-state light sources in overhead applications. In other cases, active cooling means have been required which negate the life benefits of solid-state lighting simply to reduce the weight of the heat sinks. The need exists for lightweight solid-state light sources, which relieve the requirement for cooling means by the fixture manufacturers.

Solid state lighting typically consists of a light emitting diode outputting in the UV/Blue wavelengths covered by a luminescent powder dispersed within an organic matrix, such as silicone, as shown in Cao U.S. Pat. No. 6,634,770. As disclosed in Cao, additional heat sinking means cool the light emitting diode. But the phosphor powder is essentially thermally isolated within a low thermal conductivity matrix material. As the efficiency of the light emitting diodes have approached 60% or higher, more than 50% of the heat generated within the solid state light source is being generated within the phosphor powder. This heat generation leads to efficiency drops due to thermal quenching of the phosphor powder. The elevated temperature occurs because the phosphor powder is encased in a low thermal conductivity organic matrix such as silicone (thermal conductivity of 0.1 W/m/K). Even though the typical luminescent powder has a thermal conductivity within the particle itself greater than 10 W/m/K, the composite has an effective thermal conductivity which is dominated by the matrix thermal conductivity which is typically 100 times lower than the particle thermal conductivity due the lack of thermal contact between the phosphor particles Essentially the phosphor powder is encased in a thermally insulative matrix which elevates the temperature of the phosphor powder to greater than 150 degrees C. The heating is due to the stokes shift losses and the less than perfect conversion efficiency of the phosphor powders as they convert shorter wavelength light to longer wavelength light. What is required is a means of conducting the heat out of the phosphor powder while maintaining a reasonable level of transparency.

In Mesli's paper, "Improvement of Ultra High Brightness White LEDs from Global Light Industries", Proc. SPIE 6797, Manufacturing LEDs for Lighting and Displays, (2007) pp 67970N1 to 67970N9, a temperature of greater than 200 degrees C. was measured for the phosphor powders based on a single high powered LED with 550 mW of blue excitation optical output. This reduced the luminous efficiency by almost 30% and had detrimental effects on the silicone matrix. The need exists for efficient thermally conductive luminescent elements, which can remove the heat, generated within the phosphor powders due to Stokes Shift losses, scatter losses, quantum efficiency losses, and absorption losses. The powder phosphor particles in the Mesli paper are the highest temperature points in the LED device. As LED efficiency improves, this problem only becomes worse as higher blue flux densities become possible. In general, the limiting factor in overall device performance is becoming the operating temperature of the phosphor powders rather than the LED die itself.

The thermal conductivity of a composite material can be modeled to derive an effective thermal conductivity. In most cases the effective thermal conductivity is linearly related to the matrix conductivity. The effective thermal conductivity of the composite is also based on the thermal interface between the filler and the matrix materials. As stated previously, organic matrix materials used in typical solid-state lighting are silicones or epoxies, which have thermal conductivities of approximately 0.1 W/m/K. Therefore the effective thermal conductivity of the luminescent coatings used is much less than 1 W/m/K due to thermal insulative nature of the matrix surrounding the luminescent particles.

Very high loading levels of the luminescent materials can increase the effective thermal conductivity but these loading levels lead to higher optical scatter losses because the organic matrix materials typically have refractive indices around 1.5 versus phosphors, which have refractive indices of 1.8 to 2. Multi-particle scattering as modeled by Griffith in "Scattering of Ultraviolet Radiation in Turbid Suspensions", J. Appl. Phys. 81 (6), 15 Mar. 1997, pp 2538 to 2546, are strongly influenced by volume loading levels are related the square of the refractive index difference between the filler and the matrix and filler particle size. A large refractive index difference decreases the transmission, especially for thick elements, due to scattering losses. High thermal conductivity fillers also exhibit high refractive index and high volume loading of these fillers will also increase scatter losses. As stated earlier, both thermal conductivity and translucency are required to make a useful self-cooling solid-state light source. If the scatter is too high, the light generated cannot be uniformly distributed and the conversion efficiency drops dramatically. Essentially, the light within the source is trapped within luminescent element rather than being emitted. High thermal conductivity is needed to efficiently transport the heat generated within the LEDs and the luminescent elements out over a large enough surface area such that a reasonable operational temperature can be maintained for all the components in the light source. The need therefore exists for novel luminescent materials, which exhibit high thermal conductivity while maintaining low optical absorption and optical scatter losses.

The amount of heat that can be removed off a surface can be modeled as being directly proportional to the area of the surface, the temperature difference between the surface and the surrounding ambient, and the natural convection coefficient of the surface. Incandescent light sources can have surface temperatures in excess of 150 degrees C. and halogens can exceed 250 degrees C. These allows for very efficient convective and even radiative cooling of these sources. LEDs and their associated phosphor converters tend to prefer temperature under 150 degrees C. Thermal droop adversely effects LED efficiency and thermal quenching can dramatically reduce conversion efficiency in even robust phosphors like CeYag at temperatures over 150 degrees C. Approximately 20% of the heat transfer from a surface at 150 degrees C. can be via radiation with the remainder via natural convection if the ambient is close to 25 degrees C. For a given ambient condition the natural convection coefficient can only be increased slightly using induced draft cooling techniques. Therefore to effectively cool a solid-state light source the surface temperature and surface area needs to be maximized. This is best accomplished by reducing the thermal resistance between the heat sources and the cooling surface of the device. This filing discloses methods and materials, which allow for low thermal resistance designs while maintaining low optical absorption and optical scatter losses.

SUMMARY OF THE INVENTION

This invention discloses a organic/inorganic thermally conductive translucent luminescent element based on ceramic precursors including, but not limited to, polysilazanes, silicones, polyborosiloxanes, polysilsesquionxanes, polycarbosiloxanes, polyborosilanes, polyborosilazanes, polysilsesquiazanes, polysilsesquicarbodiimides, polysilylcarbodiimides, polycarbosilanes, and polysiloxanes containing at least one of the following inorganic optically translucent thermally conductive fillers including, but not limited to, hexagonal boron nitride, cubic boron nitride, aluminum nitride, silicon carbide, and diamond. More preferably hexagonal boron nitride is dispersed via sonication, shear, or super critical processing into a ceramic precursor along with at least one luminescent element. Even more preferably, alignment of the hexagonal boron nitride particles by shear, magnetic, electrostatic, or mechanical means is disclosed. Alignment of anisotropic particles such as hexagonal boron nitride can be used to reduce optical scatter in at least one optical axis.

A result of the improved efficiency of light emitting diodes die is that self cooling light sources can now be produced with high enough output levels to be useful, if the heat generated can be spread out over a large enough area for natural convection cooling to be effective. As a rule of thumb a surface area of 1 cm2 can dissipate via natural convection cooling 1 Watt of heat with a temperature difference between the surface and the ambient of approximately 50 degrees C. LEDs are typically less than 1 mm2 therefore the heat generated within the LED die must be spread out over a larger surface area to be effectively cooled. This can be realized using an optically translucent thermally conductive luminescent element which spreads out the light and spreads heat over an area several times larger than the LEDs sources via optical waveguiding and thermal conduction as long as the physical dimensions and thermal conductivity of the optically translucent thermally conductive luminescent element exceed a specific level. As such the optically translucent thermally conductive luminescent elements with thermal conductivity greater than 1 W/m/k and surface area 10 times greater than the surface of the LED sources is disclosed. It is important to note that unlike conventional solid-state light sources the emitting surface area is also the cooling surface area in this approach. Both the heat generated in the LED and the heat generated in the luminescent element must be spread out over a large enough area for self-cooling to be realized. Heat generated in the luminescent element occurs due to stokes losses and other conversion losses. The luminescent elements disclosed also exhibit low enough scatter to act as waveguiding elements to the LED excitation light. Glare is an important aspect of all lighting applications. Direct viewing of the LED die is not only is an irritation it can also cause long term eye damage due to the photochemical nature of the blue light emitted by the LEDs. In addition much lower dopant concentrations are typically used in self cooling light sources such that conversion is does not occur in close proximity to the LEDs. In this manner the conversion losses can be spread out over the luminescent element and thereby the heating load can be spread out as well. This is a unique attribute of the luminescent elements disclosed in this invention. As an example, a typical prior art LED package would have a 50 to 100 micron thick coating consisting of 4% Ce doped Yag powder 50 wt % within a silicone matrix. The heat generated within this arrangement is localized within this small volume of material as is all the conversion. With an optical output approaching 1 optical watt from a 1 mm2 blue LED die and a typical 20% conversion loss greater than 2 watts per mm3 heat density is possible in a typical LED package. With only a couple mm2 of surface area to dissipate this heat either to ambient or back through the LED die itself temperatures in excess of 200 Celsius are possible. In general the volume of the conversion material is less than the volume of the LED itself. Using the approach disclosed in this filing, each LED die is surrounded by a luminescent element, which has a volume, orders of magnitude larger than the LED die volume. In addition, the dopant concentration in the phosphor is at least 10x lower than the prior art phosphor such that wavelength conversion and its associate heat generation occurs within a volume at least 10x larger than the LED volume. The lower dopant concentration also allows for optical spreading of both LED emission and luminescent element emission. In this manner a very useful and pleasing light emitter can be generated which eliminates the need for additional optical diffusers and heat sinks. Glare is reduced using this approach by the optical spreading of the luminescent element. As an example, 100 lumens emitted from a 1 mm2 LED die has a brightness 400x brighter than a 100 lumen 4 mm×4 mm×25 mm self cooling light stick containing that same LED die. It should be noted however, that the 1 mm2 LED die would not be able to output 100 lumens without additional heat sinking means. By spreading both the generated heat and the optical intensity over a larger surface area this approach reduces costs and improves overall efficiency without the need for additional cooling means.

Self cooling solid state emitters based on ceramics and other inorganic luminescent elements are disclosed by the inventors of this application in U.S. Pat. No. 7,285,791, U.S. Pat. No. 7,795,600, U.S. Pat. No. 7,804,099 and U.S. Pat. No. 8,158,983 and are included by reference. These sources output 50 to 100 lumens per gram. While all inorganic solutions have benefits, they typically have densities of 4 to 5 grams per cubic centimeter. In addition, high temperature processing is required to generate these materials, which increase costs. The intent of this invention is to further disclose thermally conductive translucent luminescent elements with densities between 1 and 2 grams per cubic centimeter which enable light weight self cooling solid state emitters which can output up to 500 lumens per gram.

In the previously cited patent references by the inventors of this application, self cooling solid state light sources can be created using ceramic, single crystal, and polycrystalline luminescent materials which emit more than 50 lumens per gram relying on only natural convection cooling off the emitting surfaces. Typically the thermal conductivity for these materials is greater than 10 W/m/K such as CeYag, ceramic composites, or nitride based converters. These materials have demonstrated 100 lumens per cm2 of source area, while maintaining a surface temperature less than 70 degrees C., and with source efficiencies in excess of 120 L/W. This eliminates the need for additional heat sinking means, creates distributed light sources, enables isotropic emitters and eliminates at least one packaging/interconnect layer. All these advantages reduce costs at all levels from material costs to shipping costs. These sources also illustrate the need for both high thermal conductivity and efficient optical properties. If the thermal conductivity drops below 1 W/m/K heat is trapped within the luminescent element and LED die. If the scattering losses are high, efficient conversion is not possible and most of the light generated is converted to heat rather than emitted out of the light source. As such any useful luminescent element for self-cooling light sources must exhibit both high thermal conductivity and low optical losses. Conversely, some level of surface or bulk scatter is preferred to prevent direct imaging of the LED die, which can lead to glare problems.

The self-cooling solid-state light source approach would benefit from even lower cost and even lighter weight solutions for the thermally conductive translucent luminescent materials. The basic requirements for these materials are thermal conductivity greater than 1 W/m/K, even more preferably greater than 10 W/m/K, translucency sufficient to allow for optical distribution of the light generate by the light emitting diode and the wavelength conversion elements (in-line transmission greater than 20%), and efficient wavelength conversion.

The intent of this invention is to disclose organic/inorganic composites which meet these requirements while reducing manufacturing costs by reducing or eliminating the need for high temperature growth or sintering required in the inorganic solutions disclosed previously by the inventors. In addition these materials have densities closer to 1 gram per cc versus the 4 to 5 grams per cc for the inorganic materials previously disclosed. This lighter density enables sources, which output up to 500 lumens per gram. Lighter weight reduces cost for both the light source and the fixtures they mount into. Ceramic precursors such as polysilazane are especially preferred due to their robust nature and ability to bridge the material properties gap between organics and inorganics. As shown in JP 2746192, polysilazane has been used effectively as a thin environmental protective coating on phosphor powders. In this case conversion to a full inorganic state is done using high temperature processing to provide a thin inorganic coating over the individual powders. The intent of this invention is to disclose how ceramic polymer precursors can be used to create lightweight solid thermally conductive translucent luminescent elements for self-cooling solid-state light sources.

An integrated thermally conductive leadframe will enhance the lateral thermal conductivity of the organic/inorganic composite such that lower thermal conductivity materials can be used and still maintain sufficient thermal spreading to cool the devices.

A variety of inorganic fillers can be dispersed into organic matrix such that both thermal conductivity and sufficient optical translucency to create a uniform distributed self-cooling light source.

The luminescent elements may consist of phosphor powders, phosphor flakes, fluorescent dyes, and luminescent fibers. Even more preferable is a thermoplastic composite of thermoplastic polysilazane, phosphor powder and hexagonal boron nitride flakes with an optional fluorescent dye like, but not limited to, ELJEN Technology wavelength shifters (cyan and red). A broad spectrum (high CRI) conversion element can be formed with reduced stoke shift losses by combining phosphor powders like CeYag with the wavelength shifter dyes. The cyan wavelengths are created by converting the blue and the red wavelengths are created by converting the green and yellow emitted by the phosphor powder. Alternately, yellow and red phosphors excited by the UV/Blue Led can be used but the Stokes Shift losses will be higher than the previous example.

Hexagonal boron nitride flakes can be exfoliated to submicron sheets such that translucency is improved by reduced particle size and reduced loading percentage for a given thermal conductivity. The material will be a translucent luminescent element with a thermal conductivity greater than 1 W/m/K and an in line transmission greater than 20% for a thickness greater than 500 microns. Both the thermal conductivity and transmission are critical aspects of this invention as stated earlier. The thermal conductivity must exceed 1 W/m/K to adequately transfer heat to the surrounding element off the outer emitting surface. In addition the transmission must be high enough for a reasonable thickness to allow for waveguiding of the emitted light such that the emitting surface is uniform both from the intensity and color standpoint.

The use of additional nano fillers such as, but not limited to, titanium oxide, tin oxide, zirconium oxide to the composite to raise the effective refractive index of the matrix is also disclosed. This minimizes the refractive index difference between the phosphors and thermal fillers and the surrounding matrix thereby reducing the scatter. Hexagonal boron nitride has a refractive index of 1.65 in one plane and 2.1 in the other. By raising the effective refractive index of the matrix closer to 1.65 both the scatter from the phosphor powder and the inorganic filler can be reduced. A typical phosphor powder such as CeYag has a refractive index of 1.8 or higher. The anistropic scatter based on aligned anistropic elements such as hexagonal boron nitride is disclosed. By index matching one plane scatter losses can be reduced or directional scatter can be realized if alignment is also used.

Loading levels less than 20% for the inorganic fillers are preferred to reduce scatter losses. As shown in Griffith et. al., the lower the volume fraction the filler the less the scatter. Less than 10% hexagonal boron nitride and less than 5% phosphor powder within a ceramic precursor matrix is also preferred. Bimodal or multimodal fillers such as flakes and particles are preferred due to improved connectivity between the individual filler particles. This leads to lower loading levels for a given thermal conductivity, which can lead to reduced scatter.

The ceramic precursor matrix is converted towards its inorganic state. In the case of polysilazane, this can be silicon dioxide, silicon oxynitride, or silicon nitride depending on the curing environment and temperature. For silicones and polysiloxanes this is typical silicon dioxide. Partial conversion is a way of improving the thermal conductivity of the matrix without the creation of absorptive free carbon. Even more preferred is low temperature curing of a thermoplastic polymer ceramic precursor such as provided by Kion Corp FP polysilazane. This material melts at 60 degrees C. like a thermoplastic but thermosets at temperatures above 200 degrees C. Specifically the use of a thermoplastic/thermosetting polymeric ceramic precursor filled with hexagonal boron nitride and at least one luminescent powder melt bonded, injection molded, warm pressed or otherwise formed over at least one LED and an electrical interconnect is a preferred embodiment of this invention. The thermoplastic/thermosetting element described above may be formed into a wide range of shapes and features to enhance both its optical and thermal performance including but not limited to domes, fins, pins, extraction elements, and other optical features.

Alternately, complete conversion using water vapor curing can form silicon dioxide or using nitrogen or ammonia processing can form oxynitrides or nitrides. In this case, optical absorption losses are minimized in a translucent luminescent element with a free carbon level less than 0.01% wt. In this case the use of optically translucent fillers may be reduced or eliminated depending on the thermal conductivity of the final matrix material.

Lastly, a method of forming a self cooling solid state light source is based on melt forming a thermoplastic translucent luminescent element onto a LED on a thermally conductive leadframe.

DETAILED DESCRIPTION OF THE INVENTION

Figure 1:
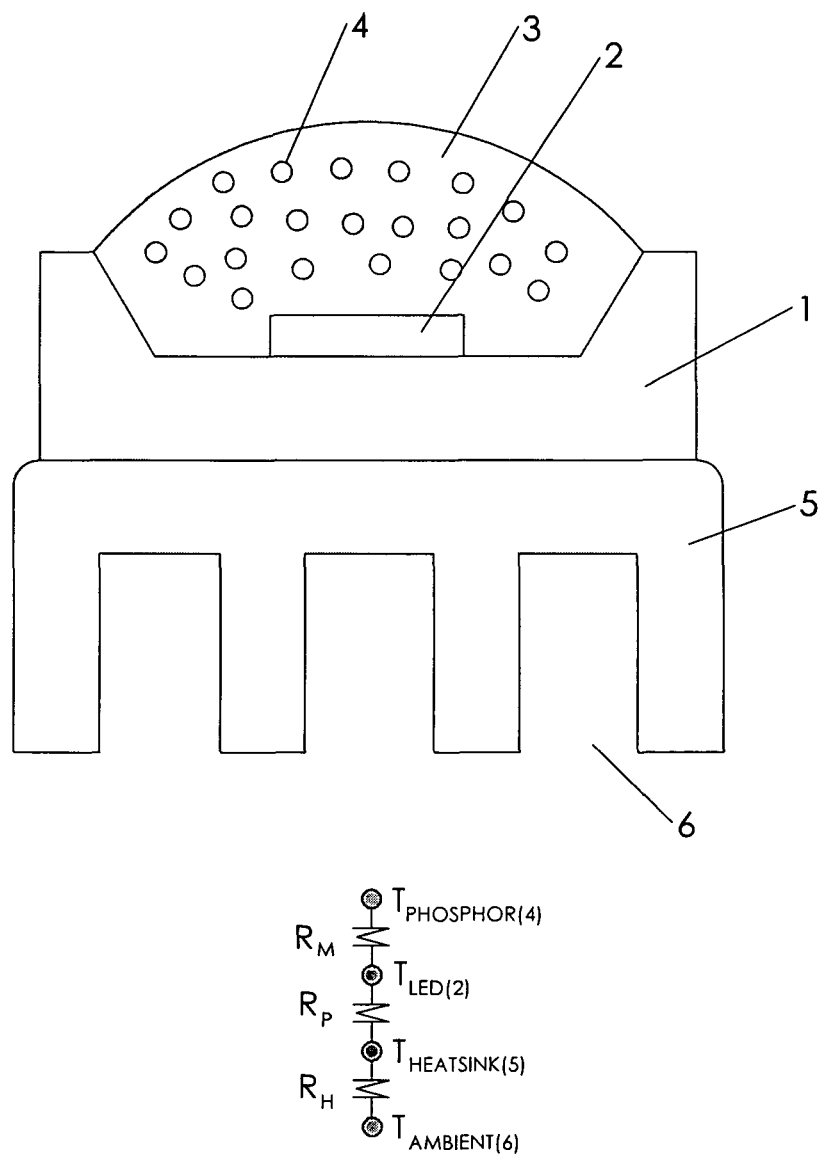
FIG. 1 depicts a side view of a typical phosphor coated LED package.

FIG. 1 depicts a typical LED package mounted onto a heat sink used to cool the device. The phosphor powder 4 is encapsulated in a matrix 3, which typically has very low thermal conductivity. This phosphor coating covers LED 2 and is part of the LED package 1. The LED package 1 is mounted to heat sink 5, which transfers the heat generated to the ambient 6 via natural or forced convection. As stated earlier, the increase in LED 1 efficiency and flux density has moved heat generation into the phosphor powder 4. As the thermal resistance schematic shows, in order for the phosphor powder 4 to be cooled by the heat sink 1, the heat generated in the phosphor powder 4 must be conducted the matrix 3 which has a thermal resistance R(m) then through the LED 2 and package 1 which has a thermal resistance R(p) then to the heat sink 5 and finally to the ambient via thermal resistance R(h) which is determined by the convective heat transfer coefficient, heat sink physical parameters and temperature difference between the heat sink and ambient. As the LED 1 efficiency has increased, the majority of the) heat generated has moved from the LED 1 to the phosphor powder 4. Yet the most thermally isolated element in this design is the phosphor powder 4.

Figure 2:
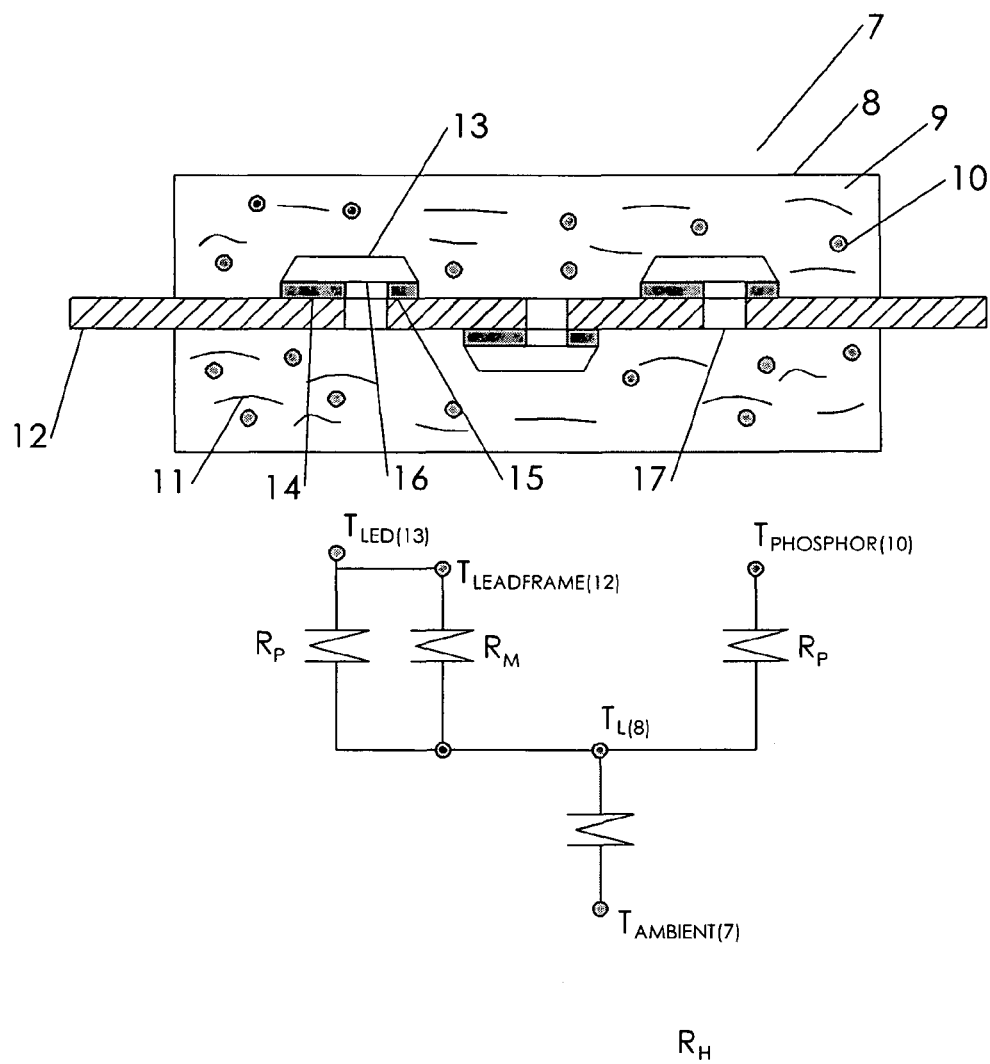
FIG. 2 depicts a side view of a self-cooling LED light source.

FIG. 2 depicts a self-cooling solid-state light source where the cooling surfaces and emitting surfaces 8 are essentially the same. In this case, LEDs 13 are embedded within a thermally conductive luminescent element 8 comprising a matrix material 9 which contains an optically translucent thermal filler 11 and at least one luminescent element 10. In this configuration, the heat generated in LED 13 has two thermal conduction paths to ambient 7. Based on the thermally conductive luminescent element 8 having a thermal conductivity greater than 1 W/m/K and even more preferably greater than 10 W/m/K, heat generated within the LED 13 can be thermally conducted out to surface 8 to ambient 7 through thermal resistance R(m). In addition, leadframe 12 can spread the heat laterally and again it can be thermally conducted out to surface 8 to ambient 7 through thermal resistance R(m). The heat generated within luminescent element 10 is thermally conducted directly out to surface 8 to ambient 7 through thermal resistance R(m). Unlike the conventional approach, this approach eliminates several thermal resistances associated with the package and heat sink. The thermal resistance schematic illustrates the importance of the thermal conductivity of the thermally conductive luminescent element. In addition, the thermally conductive luminescent element must provide efficient conversion of the LED 13 emitted light into longer wavelengths if white light sources are to be realized. This places additional constraints on the materials which can be used for the matrix 9, the at least one thermal filler 11, and at least one luminescent element 10.

As depicted, a direct die attach LED 13 is shown soldered to leadframe 12. Alternate die types including flip chip, wire-bonded, and mechanically bonded interconnects are embodiments of this invention. Leadframe 12 may consist of a metal or solder coated metal. Ribbon, tape, rod, tube, and plates of metal coated or uncoated with solder is disclosed for leadframe 12. Optionally, leadframe 12 may consist of a thermally conductive ceramic, single crystal, polycrystalline or amorphous inorganic material including but not limited to sapphire, translucent polycrystalline alumina, glass, polymer, composite with an electrical interconnect means. Leadframe 12 may be opaque, translucent, luminescent, or transparent to all or a portion of the UV and visible spectrum. The electrical interconnect may be printed, sprayed, patterned using lithographic means or a transparent conductive oxide layer. The leadframe 12 may allow for parallel, series, series/parallel, anti-parallel, and combinations of both for interconnecting direct die attach LED 13. Direct die attach LED 13 may be a nitride based LED or AlInGaP based LEDs or combinations of both. Additionally light sources in which both nitride based LEDs and AlInGaP LEDs are used, the use of separate Leadframes 12 such that the two types of LEDs can be independently controlled is disclosed. While direct attach nitride LEDs have become commercially available, direct attach Alingap LEDs have not been introduced due to difficulty in manufacturing. The advantage of direct attach LEDs is that wirebonding and flip chip mounting techniques can be eliminated. A direct attach AlinGap LED is formed by direct growth of AlinGaP epi layers on a flexible freestanding nitride foil. The flexible freestanding nitride foil may be doped or undoped and consists of one of the following alloys, GaN, InN, AlN, AlinN, GaAlN, GaInAlN, or dilute nitrides. Alternately, the flexible freestanding nitride foil can be wafer bonded to an Alingap red LED epi grown on a GaAs substrate after which the GaAs substrate is removed via chemical etching, mechanical grinding, or other removal means. Once the absorptive GaAs substrate has been removed, contacts can be formed by selectively etching through the AlInGaP active layers to allow access to the GaP window layer. Metal contacts can be formed to both n and p side of the epi as known in the art. The nitride layer exhibit very low alpha to emission from the AlinGap layer. The resulting nitride/AlInGaP LED is a preferred embodiment of this invention. For the direct die attach case, contacts 14 and 15 are soldered to leadframe 12 either via solder on the LED die 13 or via solder or sintered silver on leadframe 12. A preferred material for leadframe 12 is solar cell tabbing foil, which consists of copper foil coated with 3 to 15 microns of solder. Even more preferred is 75 micron copper foil coated with 5 to 10 microns lead-free solder. The leadframe may be one or more pieces and isolation cuts 17 may be done via mechanical, laser, or photochemical etching means to allow for series, parallel, series/parallel, and anti-parallel interconnect of LED die 13. The attachment of direct attach LED die 13 onto leadframe 12 is such that isolation pad 16 aligns with isolation cuts 17 in a reel to reel operation followed by attachment of thermally conductive luminescent elements 8. Attachment may be via warm pressing, gluing, or other bonding steps. The use of thermoplastic/thermosetting material such that direct bonding to the led die 13 and leadframe 12 is preferred.

Figure 3:
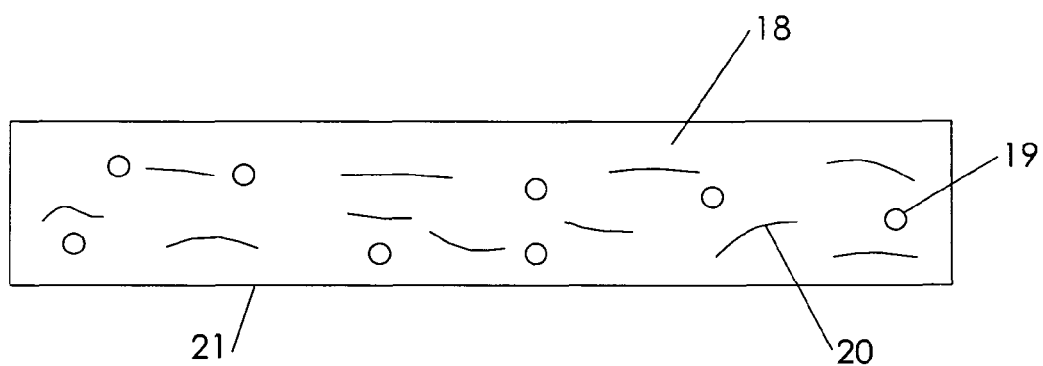
FIG. 3 depicts a side view of a thermoplastic matrix with hexagonal boron nitride flakes and phosphor powders.

FIG. 3 depicts a thermally conductive luminescent element 21 containing at least one optically translucent thermal filler 20 and at least one luminescent element 19 within a matrix 18. The requirements for the thermally conductive luminescent element 21 is thermal conductivity greater than 1 W/m/K, more preferably greater than 10 W/m/K, in-line transmission greater than 20% for 500 microns of thickness, and integrated conversion efficiency greater than 70% for a thickness 500 microns. The thickness constraint is to allow for both optical spreading and physical robustness of the finished device. As previously disclosed, inorganic thermally conductive luminescent elements based on CeYag ceramics and single crystal materials have been used to create self-cooling light sources. In this case CeYag has a thermal conductivity of 14 W/m/K and is transparent forming an excellent waveguide for spreading the light out. Using this approach 100 lumens of white light can be generated in source area of 1 cm2 while maintaining a steady state surface temperature less than 80 C via natural convection cooling in a 25 C ambient. The density of CeYag is 4.55 gram per cubic centimeter. The source has a volume of 0.2 cubic centimeters with an electrical input of 1 watt thereby operating with 100 lumens/watt efficiency and an output of 100 lumens per gram. The intent of this invention is to disclose composite materials which meet or exceed the above performance levels using a composite material with a density less than 3 grams per cubic centimeter, even more preferably between 1 and 2 grams per cubic centimeter. This enables the creation of useful self cooling solid state light sources which output greater than 100 lumens per gram, even more preferably greater than 300 lumens per gram. Sources with output greater than 30 lumens are preferred with sources with output greater than 100 lumens being more preferred.

Thermal conductivity, translucency, and conversion efficiency limits must be met in order to meet these requirements. As such, preferred optically translucent fillers 20 are, but not limited to, hexagonal boron nitride (flakes, nanobelts, nanoribbons), SiC, AlN, diamond, and other filler with a thermally conductivity in at least one crystal plane greater than 50 W/m/K and an alpha less than 100 cm(−1) from 400 nm to 700 nm. Even more preferred is an alpha less than 1 cm(−1) from 400 nm to 700 nm. Sonication, shear mixing, and super critical processing can disperse and/or exfoliate the thermal fillers into the matrix 18. As an example, hexagonal boron nitride flakes may be used as thermal filler 20 with an average flake size of 100 microns and an average thickness of 5 microns can be mixed using a heated three roll mill within a polysilazane thermoplastic/thermoset matrix 18 sold as KION FP. This polymeric ceramic precursor behaves as a thermal plastic melting at 60 degrees C. and crosslinks like a thermoset when heated above 150 degrees C. Using the three roll mill, the hexagonal boron nitride flakes are exfoliated into thinner sheets based on shearing action of mill and the polysilazane matrix 18. Exfoliation reduces particle size, which in turn reduces scatter losses. In addition exfoliation increases the thermal conductivity for a given loading percentage of thermal filler 20 which also reduces scatter losses. After exfoliation, the thermal filler 20, CeYag powder is blended into the material. In this manner, a multi modal particle size distribution can be created wherein the CeYag particles to act as wavelength conversion elements but also to serve to thermally interconnect the exfoliated hexagonal boron nitride flakes thereby increasing the thermal conductivity of the thermally conductive luminescent element 21. As an additional step, nanoparticles, including but not limited to, titanium oxide, tin oxide, and zirconium oxide may be added to the matrix either prior to or after exfoliation to increase the refractive index of the matrix thereby reducing scatter even further. Most polymeric materials have a refractive index under 1.6, with many less than 1.5. Inorganic materials like boron nitride, Yag, etc. have refractive indices greater than 1.7 with some over 2.0. The amount of scatter can be reduced by increasing the refractive index of the matrix using nano particles to 1.6 or higher. This is especially true of hexagonal boron nitride, which has an anisotropic refractive index of 1.65 and 2.1. A preferred embodiment of this invention is the incorporation of high index nanoparticles into the matrix 20 such that the effective refractive index of the matrix plus nanoparticles is approximately equal to 1.65 thus index matching one plane of the hexagonal boron nitride. Alternately, high aspect ratio flakes can be formed based on deposition of a high thermal conductivity inorganic layer via plasma or thermal deposition onto a sacrificial organic layer. To increase the yield form such a process, multiple depositions of alternating layers of organic and inorganic materials can be deposited on a rotating drum substrate. Such a process is used by Sigma Labs to form nanoflakes of copper, silver, aluminum, as well as inorganic oxides and nitrides. The high aspect ratio of these flakes allow for increase thermal conductivity due to overlap as compared to particle based fillers. Most preferred are high aspect ratio flakes of hexagonal or cubic BN, diamond, GaN, AlN, and oxides such as ITO and ZnO.

The luminescent filler 19 may consist of garnets, oxides, SiON, AlSiON, nitrides, sulfides, and other luminescent powders, flakes, and fibers. In addition wavelength shifting dyes, with a specific example being cyan and red wavelength shifting dyes sold by Eljen technologies, can used as well as the combination of inorganic luminescent materials and fluorescent dyes. As an example, Eljen red wavelength shifting dye is dissolved in xylene and polysilazane with hexagonal boron nitride flakes. The mixture is sonicated for 1 hour to exfoliate the hexagonal boron nitride. The mixture is heated to evaporate off the xylene leaving a red powder consisting of polysilazane coated hexagonal boron nitride flakes. This powder is incorporated into the polysilazane/CeYag powders and injection molded into a finished part using standard injection molding techniques. Alternately, hexagonal boron nitride is placed within a supercritical reactor and exposed to super critical CO2 at 3000 psi and 80 C for 12 hours. The mixture is mixed with polysilazane and CeYag powder with the supercritical CO2 acting as the mixture solvent. The pressure is released and the mixture is formed and cured using warm pressing techniques. The resulting material exhibits an in-line transmission of greater than 20% for a thickness of 500 microns and a total conversion efficiency greater than 30%.

Matrix 18 may be based on ceramic precursors including but not limited to polysilazanes, polyborosiloxanes, polysilsesquionxanes, polycarbosiloxanes, polyborosilanes, polyborosilazanes, polysilsesquiazanes, polysilsesquicarbodiimides, polysilylcarbodiimides, polycarbosilanes, and polysiloxanes. Thermoplastic versions of these materials are preferred. Crosslinking may be via thermal, electron beam, and catalytic methods. Partial and complete conversion of these polymeric ceramic precursors to their ceramic state can also be used as long as the free carbon generated is less than 0.1 wt % to prevent absorption losses. Water vapor, ammonia, nitrogen atmospheres can be used to reduce free carbon. In the case of partial and complete conversion, the amount of thermal filler 20 can be reduced or eliminated depending on the thermal conductivity of the resulting matrix 18. As an example, complete conversion of polysilazane to $Si_3N_4$ creates a matrix 18 with a thermal conductivity greater than 10 W/m/k. Alternately, conversion of polysilazane or polysiloxane or silicone to glass creates a matrix 18 with a thermal conductivity closer to 1 W/m/K. In this case, addition thermal filler 20 may be used to further enhance the effective thermal conductivity of the material. In addition to thermal conductivity the partial or complete conversion may affect the amount or need for nanoparticles to reduce scatter. In general however, the preferred embodiment of this invention is to create thermally conductive luminescent elements with densities less than 3 grams per cubic centimeter and even more preferably with densities between 1 and 2 grams per cubic centimeter.

Figure 4:
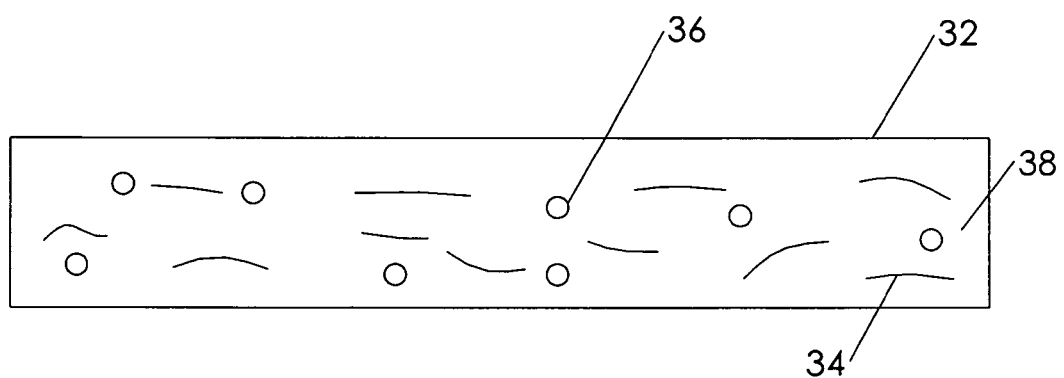
FIG. 4 depicts a side view of a luminescent transfer adhesive.

FIG. 4 depicts a thermally conductive luminescent element 32 containing at least one optically translucent thermal filler 34 and at least one luminescent element 36 within a matrix 38. Alternately, matrix 38 may be an adhesive layer. Even more preferably, thermally conductive luminescent element 32 consists of a matrix 38 that is a flexible transfer adhesive containing at least one luminescent element 36. Most preferably, thermally conductive luminescent element 32 consists of a matrix 38 that is a flexible transfer adhesive containing at least one luminescent element 36 and at least one optically translucent thermal filler 34. As an example, thermally conductive luminescent element 32 could be a 25 micron thick silicone transfer adhesive as matrix 38 containing 4 wt. % 2% Ce doped Yag phosphor powder as at least one luminescent element 36 and 10 wt % hexagonal boron nitride powder as at least one optically translucent thermal filler 34. Optionally, the hexagonal boron nitride can be magnetically aligned to enhance thermal conductivity in one plane using the diamagnetic anisotropy of the hexagonal boron nitride. In this case thermally conductive luminescent element 32 may be used as a luminescent transfer adhesive layer for bonding together additional elements to form solid-state light sources. The use of this layer 32 as the only means of converting at least a portion of the light from at least one led to a different wavelength range or as a means of color balancing is disclosed. Excitation of the layer 32 can be performed by a LED and/or another luminescent element.

Figure 5:
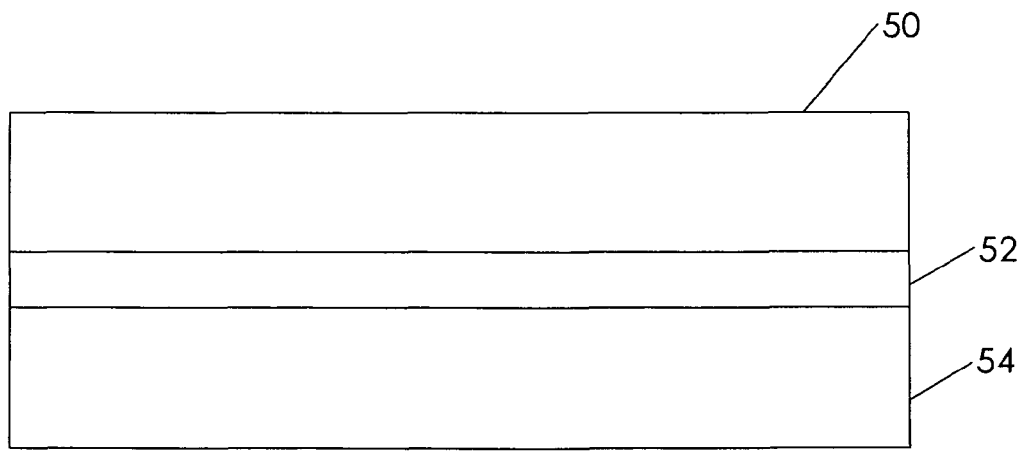
FIG. 5 depicts a side view of a luminescent transfer adhesive bonded to a translucent thermally conductive element.

FIG. 5 depicts a luminescent element formed consisting of at least one translucent thermally conductive element 50 such as but not limited to composites of alumina and Ce doped YAG, sapphire, translucent alumina, spinel, mgo, cubic zirconia, glass, AlN, GaN, or InN with at least one thermally conductive luminescent element 52 is an embodiment of this invention. Even more preferably, the use of at least two of the translucent thermally conductive elements 50 and 54 bonded together with at least one thermally conductive luminescent element 52 wherein said at least one thermally conductive luminescent element 52 is a pressure sensitive adhesive is an embodiment. As an example, a modified acrylic pressure sensitive adhesive 10 microns thick is thermally conductive luminescent element 52 adhered to one surface of the thermally conductive element 50. The thermally conductive luminescent element 52 is formed by incorporating luminescent filler and or non-luminescent fillers including but not limited to phosphor powders, phosphor flakes, fluorescent dyes in both organic and inorganic states, boron nitride, aln, al2o3, and other thermally conductive fillers into the modified acrylic adhesive layer. Red, cyan, IR, yellow, green and other luminescent colors can be added as needed to create a given color spectrum. Most preferably, thermally conductive element 50 is alumina and Ce doped Yag composite which converts the blue/UV emission of a nitride LED embedded in the thermally conductive element 50 as previously disclosed into blue and yellow and the thermally conductive layer 52 is used to convert some of the blue and/or yellow spectrum into other colors like cyan and red to make a higher CRI output spectrum. Nitride, oxynitride, aluminate, silicates, oxides, and Sialon phosphors may be used to form thermally conductive luminescent element 52. Eljen Technology Inc. wavelength shifter dyes may also be used to convert at least a portion of the blue and/or yellow spectrum into cyan and red colors. Wavelength shifters exhibit lower stokes shift losses than most phosphor powders especially when converting yellow to red.

Figure 6A:
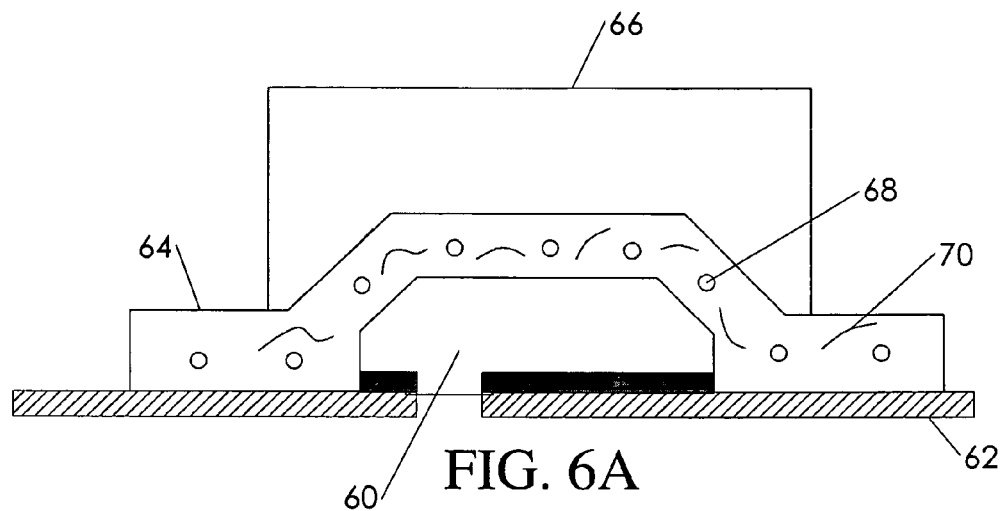
FIGS. 6A and 6B depict side views of directional and isotropic solid-state light sources based on bonded translucent thermally conductive elements using luminescent transfer adhesives.

FIG. 6A depicts a self cooling light source comprising at least one light emitting diode 60, an electrical interconnect means 62, at least one thermally conductive luminescent element 64 and at least one translucent thermally conductive element 66 is a preferred embodiment of this invention. At least one translucent thermally conductive element 66 may optionally be luminescent to the light emitted by said at least one light emitting diode 60. As an example, a direct attach blue light emitting diode 60, a solder coated leadframe 62 to which direct attached LED die 60 is solder to is bonded via at least one thermally conductive luminescent element 64, which is a silicone transfer adhesive layer containing a least one luminescent element 68 such as but not limited to phosphor powder, phosphor flake, phosphor fiber, fluorescent dye, or combinations of these elements, and translucent thermally conductive filler 70 such as but not limited hexagonal boron nitride, silicon nitride, aluminum nitride, or other translucent fillers with thermal conductivity greater than 10 W/m/K to at least one translucent thermally conductive element 66 which may consist of but not limited to Yag (doped or undoped), spinel, sapphire, translucent alumina, polycrystalline alumina, mgo, or other translucent or transparent thermally conductive elements.

Figure 6B:
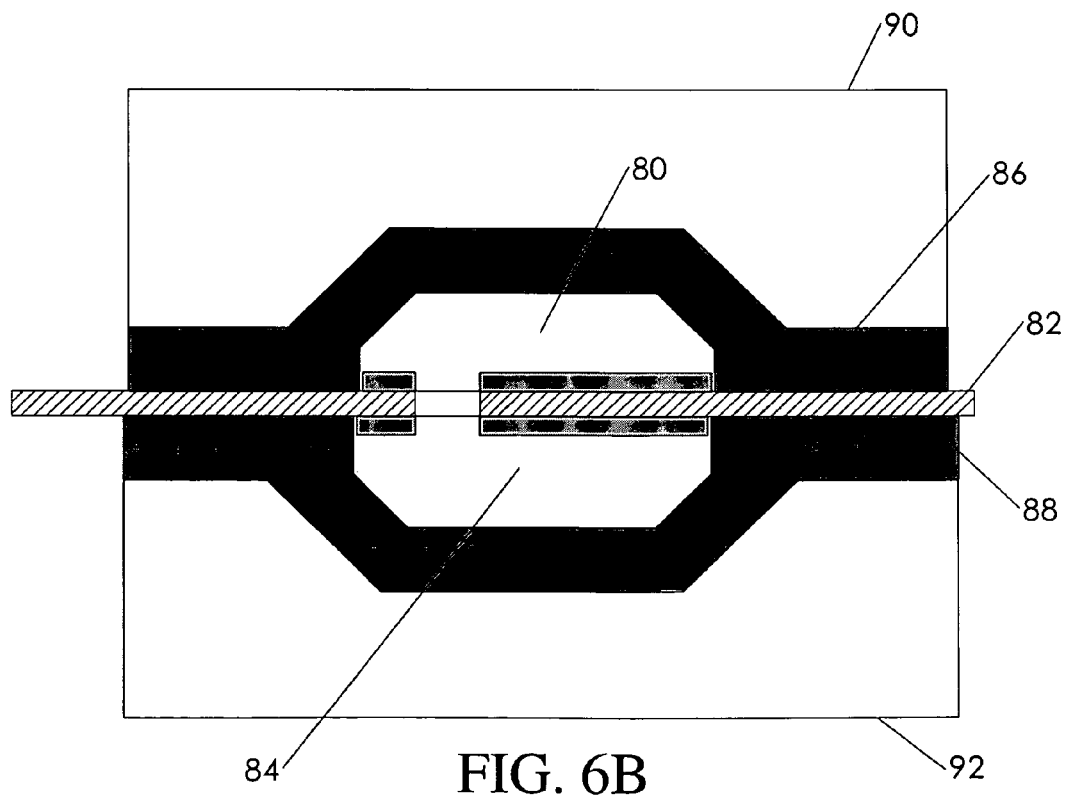

FIG. 6B depicts a isotopic emitter consisting of at least two LED 80 and 84, at least one electrical interconnect means 82, at least two thermally conductive luminescent bonding elements 86 and 88, and at least two translucent thermally conductive elements 90 and 92. Most preferably, the thermally conductive luminescent elements 86 and 88 is greater than 1 W/m/K and the thermally conductivity of the translucent thermally conductive elements 90 and 92 is greater than 10 W/m/k. Alternately, thermoplastic bonding layers can be used including but not limited to FEP, polysilazanes, and other melt bondable materials with and without luminescent and/or thermally conductive fillers for at least one thermally conductive luminescent element 68.

It should be noted that thin layers are preferred for the thermally conductive luminescent elements disclosed such that heat generated within the thermally conductive luminescent elements themselves, LEDs, and other elements can be thermally connected. In this manner self-cooling light sources can be realized in which the emitting surfaces of the light sources are also the cooling surfaces of the light source without the inherent need for additional heat sinking means. By eliminating the need for additional heat sinking and combining the wavelength conversion functions with the thermal heat sinking functions light source which emit greater than 30 lumens/gram can be realized.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

The invention claimed is:

1. A solid state light source comprising:
   at least one light emitting diode;
   at least one thermally conductive translucent luminescent element having a matrix material, said matrix material containing an optically translucent thermal filler and at least one luminescent element, said at least one light emitting diode being embedded within said at least one thermally conductive translucent luminescent element, said at least one thermally conductive translucent luminescent element having an emitting surface for emitting light from said at least one light emitting diode;
   at least one leadframe electrically connecting said at least one light emitting diode and thermally distributing heat generated by said at least one light emitting diode to said at least one thermally conductive translucent luminescent element;
   wherein said at least one thermally conductive translucent luminescent element transfers a significant amount of the heat generated by said at least one light emitting diode and the heat generated within said at least one thermally conductive translucent luminescent element to the surrounding ambient, said at least one thermally conductive translucent luminescent element having a cooling surface for emitting heat generated by said at least one light emitting diode and the heat generated within said at least one thermally conductive translucent luminescent element, said cooling surface of said at least one thermally conductive translucent luminescent element and said emitting surface of said at least one thermally conductive translucent luminescent element being essentially the same surfaces
   wherein said at least one light emitting diode is AlInGaP epilayers grown on a freestanding nitride layer.

2. A solid state light source comprising:
   at least one light emitting diode;
   at least one thermally conductive translucent luminescent element having a matrix material, said matrix material containing an optically translucent thermal filler and at least one luminescent element, said at least one light emitting diode being embedded within said at least one thermally conductive translucent luminescent element, said at least one thermally conductive translucent luminescent element having an emitting surface for emitting light from said at least one light emitting diode;
   at least one leadframe electrically connecting said at least one light emitting diode and thermally distributing heat generated by said at least one light emitting diode to said at least one thermally conductive translucent luminescent element;
   wherein said at least one thermally conductive translucent luminescent element transfers a significant amount of the heat generated by said at least one light emitting diode and the heat generated within said at least one thermally conductive translucent luminescent element to the surrounding ambient, said at least one thermally conductive translucent luminescent element having a cooling surface for emitting heat generated by said at least one light emitting diode and the heat generated within said at least one thermally conductive translucent luminescent element, said cooling surface of said at least one thermally conductive translucent luminescent element and said emitting surface of said at least one thermally conductive translucent luminescent element being essentially the same surfaces
   wherein said at least one light emitting diode is a freestanding nitride layer wafer bonded onto an AlInGaP epilayer grown on a GaAs substrate wherein the GaAs substrate is subsequently removed.

3. A solid state light source comprising:
   at least one light emitting diode;
   at least one thermally conductive translucent luminescent element having a matrix material, said matrix material containing an optically translucent thermal filler and at least one luminescent element, said at least one light emitting diode being embedded within said at least one thermally conductive translucent luminescent element, said at least one thermally conductive translucent luminescent element having an emitting surface for emitting light from said at least one light emitting diode;
   at least one leadframe electrically connecting said at least one light emitting diode and thermally distributing heat generated by said at least one light emitting diode to said at least one thermally conductive translucent luminescent element;
   wherein said at least one thermally conductive translucent luminescent element transfers a significant amount of the heat generated by said at least one light emitting diode and the heat generated within said at least one thermally conductive translucent luminescent element to the surrounding ambient, said at least one thermally conductive translucent luminescent element having a cooling surface for emitting heat generated by said at least one light emitting diode and the heat generated within said at least one thermally conductive translucent luminescent element, said cooling surface of said at least one thermally conductive translucent luminescent element and said emitting surface of said at least one thermally conductive translucent luminescent element being essentially the same surfaces wherein said at least one light emitting diode is a direct attach AlInGaP/GaN LED.

\* \* \* \* \*